United States Patent
Kono

(10) Patent No.: US 8,416,605 B2
(45) Date of Patent: Apr. 9, 2013

(54) NON-VOLATILE SEMICONDUCTOR STORAGE DEVICE

(75) Inventor: Fumihiro Kono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 162 days.

(21) Appl. No.: 13/018,832

(22) Filed: Feb. 1, 2011

(65) Prior Publication Data

US 2011/0299319 A1    Dec. 8, 2011

(30) Foreign Application Priority Data

Jun. 3, 2010  (JP) ................................ 2010-127623

(51) Int. Cl.
G11C 11/00    (2006.01)
(52) U.S. Cl. ........................................ 365/148; 365/158
(58) Field of Classification Search .................. 365/148, 365/158
See application file for complete search history.

(56) References Cited

U.S. PATENT DOCUMENTS

2004/0114444 A1* 6/2004 Matsuoka ..................... 365/200

FOREIGN PATENT DOCUMENTS

| JP | 2008-16092 | 1/2008 |
|---|---|---|
| JP | 2008-108297 | 5/2008 |
| JP | 2009-93724 | 4/2009 |

OTHER PUBLICATIONS

U.S. Appl. No. 13/043,736, filed Mar. 9, 2011, Kono.
U.S. Appl. No. 12/876,746, filed Sep. 7, 2010, Fumihiro Kono.

* cited by examiner

*Primary Examiner* — Michael Tran
(74) *Attorney, Agent, or Firm* — Oblon, Spivak, McClelland, Maier & Neustadt, L.L.P.

(57) ABSTRACT

A non-volatile semiconductor storage device includes a memory cell array having plural electrically rewritable memory cells, each memory cell including a variable resistive element storing resistance values as data in a non-volatile manner, and a data writing unit having a voltage supply circuit which supplies a voltage needed to write data to the plural memory cells, and a resistance state detecting circuit which detects a resistance state of the variable resistive element at the time of writing the data. The data writing unit stops the supply of the voltage to the memory cell where a resistance state of the variable resistive element becomes a desired resistance state, among the plural memory cells, according to the detection result of the resistance state detecting circuit.

19 Claims, 11 Drawing Sheets

NON-VOLATILE SEMICONDUCTOR STORAGE DEVICE

CROSS-REFERENCE TO RELATED APPLICATIONS

This application is based upon and claims the benefit of priority from the prior Japanese Patent Application No. 2010-127623, filed on Jun. 3, 2010, the entire contents of which are incorporated herein by reference.

FIELD

Embodiments described herein relate to a non-volatile semiconductor storage device.

BACKGROUND

Conventionally, as an electrically rewritable non-volatile memory, there is well known a flash memory in which memory cells having a floating gate structure are NAND connected or NOR connected to one another to constitute a cell array. As a non-volatile memory allowing high-speed random access, a ferroelectric memory is also known.

Meanwhile, as a technology for further miniaturizing a memory cell, a resistance change type memory that uses a variable resistive element in a memory cell is proposed. Examples of the variable resistive element include a phase-change memory element that changes a resistance value by a state change of crystal/amorphousness of a chalcogenide compound, an MRAM element that uses a resistance change based on a tunnel magnetoresistance effect, a memory element of a polymer ferroelectric RAM (PFRAM) in which a resistive element is formed of a conductive polymer, and a ReRAM element that changes resistance by application of an electric pulse.

The memory cell of the resistance change type memory can be constituted of a serial circuit of a Schottky diode and a variable resistive element in place of a transistor. For this reason, even when one memory cell is provided at each intersection of word lines and bit lines, a high degree of integration can be achieved. In addition, data can be written/erased independently in each memory cell, not in a page unit like in a NAND-type flash memory.

However, a predetermined number of memory cells may be regarded as a page in the NAND-type flash memory in consideration of compatibility with the NAND-type flash memory, and data may be written/erased in a page unit.

In order to read/erase the data per page from the resistance change type memory in this manner, there is considered a method for first reading data of a predetermined number of memory cells of the page, subsequently masking the memory cells where data does not need to be written, then writing data into the page, finally masking the memory cells where data does not need to be erased, and then erasing data of the corresponding page.

However, when the data is written/erased, the corresponding process has three steps that include a step of reading data, a step of writing data, and a step of erasing data. For this reason, it is problematic that processing time and power consumption are large.

DETAILED DESCRIPTION

A non-volatile semiconductor storage device according to an embodiment includes: a memory cell array having a plurality of first wiring lines, a plurality of second wiring lines disposed to intersect the first wiring lines, and a plurality of electrically rewritable memory cells disposed at intersections of the first and second wiring lines, each memory cell including a variable resistive element storing resistance values as data in a non-volatile manner; and a data writing unit that has a voltage supply circuit which supplies a voltage needed to write data to the plurality of memory cells through the first and second wiring lines, and a resistance state detecting circuit which detects a resistance state of the variable resistive element at the time of writing the data. The data writing unit stopping the supply of the voltage to the memory cell where a resistance state of the variable resistive element becomes a desired resistance state, among the plurality of memory cells, according to the detection result of the resistance state detecting circuit.

Hereinafter, a non-volatile semiconductor storage device according to an embodiment will be described with reference to the drawings.

[Overall Configuration]

Figure 1:
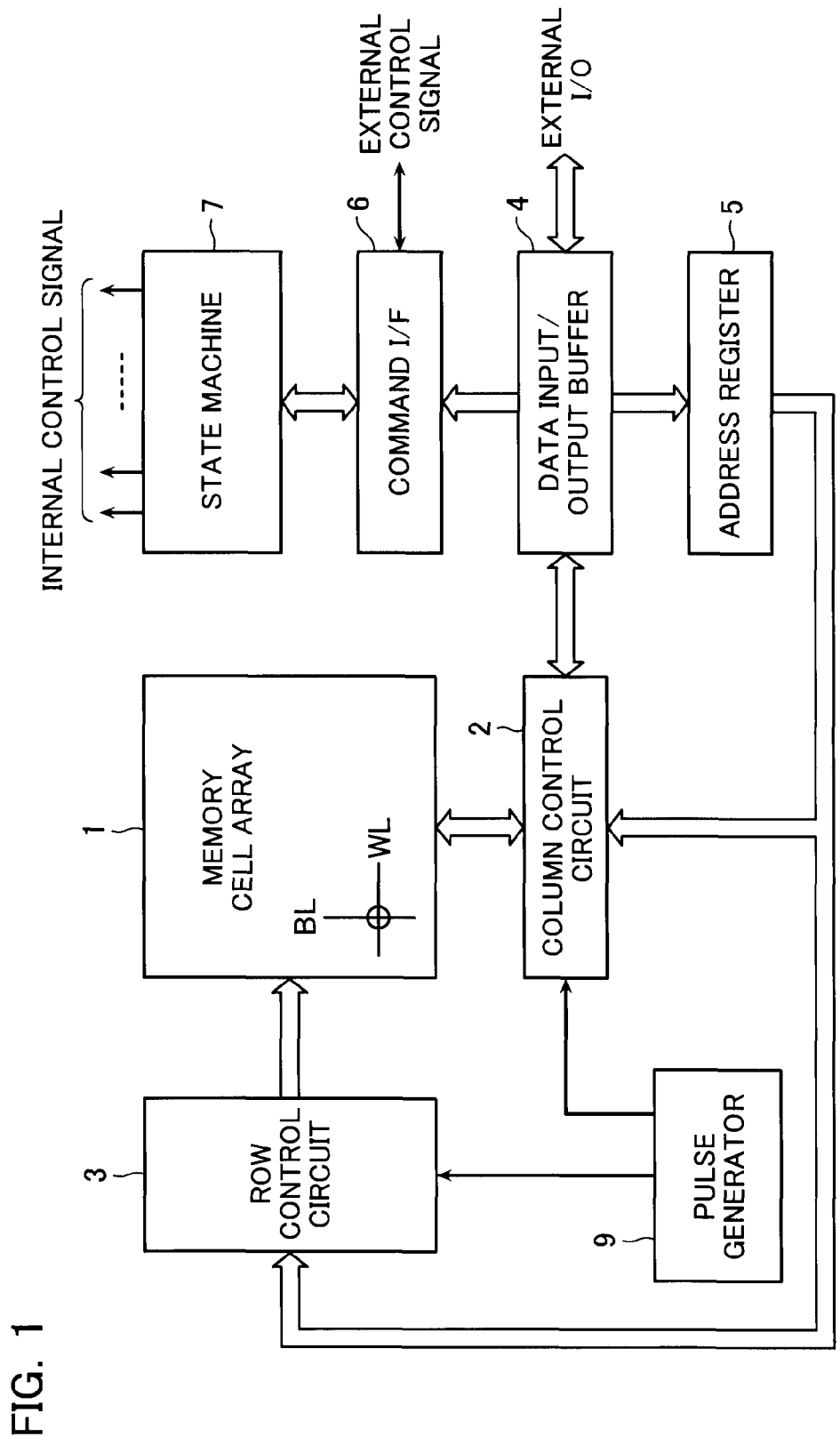
FIG. 1 is a block diagram of a non-volatile semiconductor storage device according to an embodiment.

FIG. 1 is a block diagram of a non-volatile semiconductor storage device according to a first embodiment.

The non-volatile semiconductor storage device includes a memory cell array 1 in which memory cells using a ReRAM (variable resistive element) to be described below are disposed in a matrix. At a position adjacent to the memory cell array 1 in a direction of bit lines BL, a column control circuit 2 that controls the bit lines BL of the memory cell array 1, writes data to the memory cells, and reads data from the memory cells is provided. At a position adjacent to the memory cell array 1 in a direction of word lines WL, a row control circuit 3 that selects the word lines WL of the memory cell array 1 and supplies a voltage needed to write data to the memory cells and read data from the memory cells is provided. The column control circuit 2 and the row control circuit 3 are included in a data writing unit.

A data input/output buffer 4 is connected to an external host (not shown) through an I/O line, and receives write data, outputs read data, and receives address data or command data. The data input/output buffer 4 transmits the received write data to the column control circuit 2, receives the data read from the column control circuit 2, and outputs the data to the outside. An address supplied from the outside to the data input/output buffer 4 is transmitted to the column control circuit 2 and the row control circuit 3 through an address register 5. A command supplied from a host to the data input/output buffer 4 is transmitted to a command interface 6. The command interface 6 receives an external control signal from the host and determines whether the data input to the data input/output buffer 4 is the write data, the command or the address. When it is determined that the input data is the command, the command interface 6 transmits the command as a received command signal to a state machine 7. Since the state machine 7 wholly manages the non-volatile semiconductor storage device, the state machine 7 receives the command from the host, reads data, writes data, and manages an input/output of data. The external host can receive status information managed by the state machine 7 and can determine an operation result. This status information is also used in write control.

A pulse generator 9 is controlled by the state machine 7. By this control, the pulse generator 9 can output a pulse of an arbitrary voltage at arbitrary timing. Specifically, the state machine 7 inputs an externally given address through the address register 5, determines a memory cell to which an access is given, and controls the height/width of the pulse from the pulse generator 9, using a parameter corresponding to the determined memory cell. In this case, the generated pulse can be transmitted to an arbitrary wiring line that is selected by the column control circuit 2 and the row control circuit 3.

Further, peripheral circuit elements other than the memory cell array 1 can be formed in a silicon substrate immediately below the memory cell array 1. Thereby, a chip area of the semiconductor storage device can become approximately equal to an area of the memory cell array 1.

[Memory Cell and Memory Cell Array]

Figure 2:
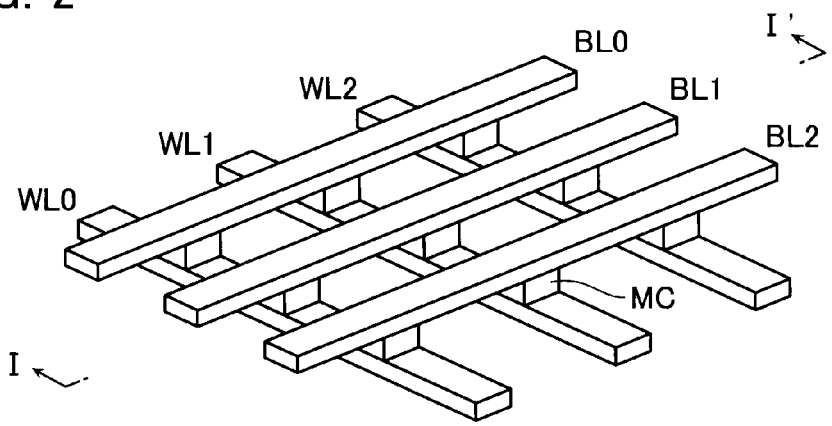
FIG. 2 is a perspective view of a part of a memory cell array of the non-volatile semiconductor storage device.
Figure 3:
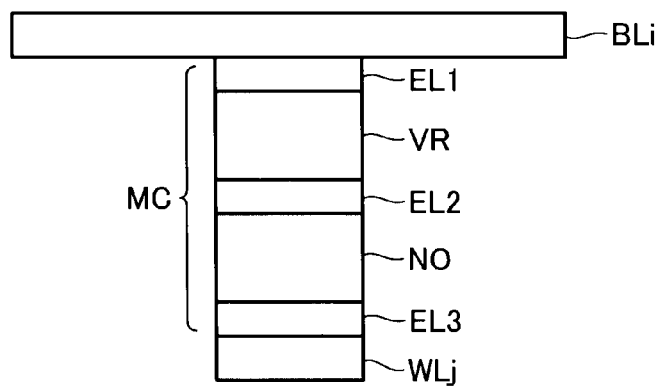
FIG. 3 is a cross-sectional view of one memory cell taken along the line I-I' of FIG. 2 and viewed from an arrow direction.

FIG. 2 is a perspective view of a part of the memory cell array 1, and FIG. 3 is a cross-sectional view of one memory cell taken along the line I-I' of FIG. 2 and viewed from an arrow direction.

Plural word lines WL0 to WL2 (first wiring lines) are disposed in parallel, plural bit lines BL0 to BL2 (second wiring lines) are disposed in parallel to intersect the plural word lines, and each memory cell MC is disposed at each of intersections of the word lines and the bit lines to be interposed between both wiring lines. The word lines WL and the bit lines BL are preferably made of a material that has strong resistance against heat and has a low resistance value. For example, W, WSi, NiSi or CoSi can be used.

As shown in FIG. 3, the memory cell MC includes a circuit where a variable resistive element VR and a non-ohmic element NO are connected in series.

Since a resistance value of the variable resistive element VR can be changed through current, heat, chemical energy or the like based on voltage application, electrodes EL1 and EL2 that function as a barrier metal and an adhesive layer are disposed on and below the variable resistive element VR. As an electrode material, Pt, Au, Ag, TiAlN, SrRuO, Ru, RuN, Ir, Co, Ti, TiN, TaN, LaNiO, Al, PtIrO$_x$, PtRhO$_x$ or Rh/TaAlN is used. A metal film that equalizes orientation can be inserted. A buffer layer, a barrier metal layer, and an adhesive layer can be separately inserted.

As the variable resistive element VR, the ReRAM which is formed of a composite compound including positive ions becoming a transition element and whose resistance value is changed by movement of the positive ions can be used.

Figure 4:
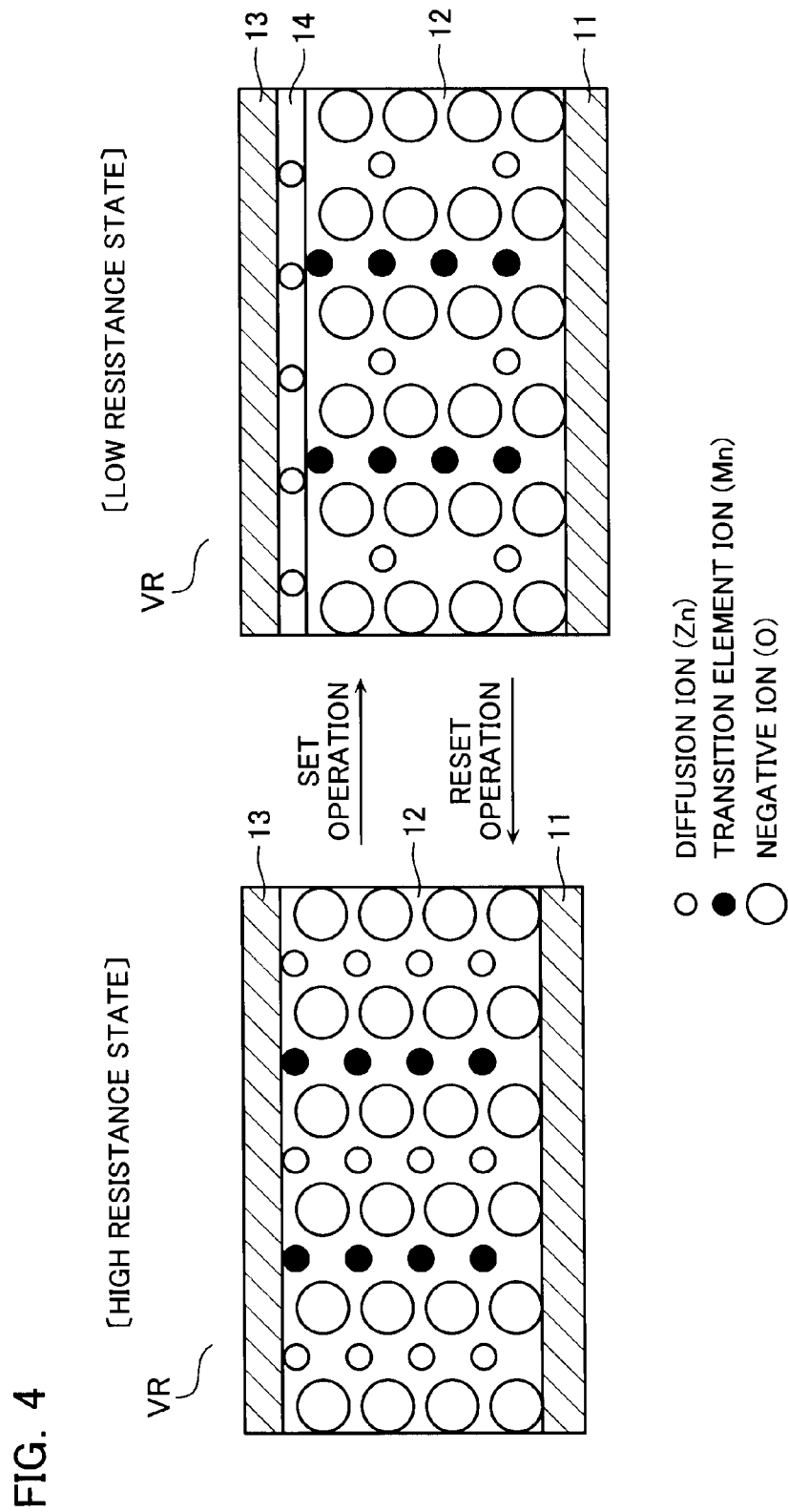
FIG. 4 is a schematic cross-sectional view showing an example of a variable resistive element of a memory cell of the non-volatile semiconductor storage device.

FIG. 4 shows an example of the variable resistive element VR. In the variable resistive element VR shown in FIG. 4, a recording layer 12 is disposed between electrode layers 11 and 13. The recording layer 12 is formed of a composite compound that has at least two kinds of positive ion elements. In this case, the positive ion elements of at least one kind are transition elements having d orbital where electrons are imperfectly filled, and the shortest distance between the adjacent positive ion elements is 0.32 nm or less. Specifically, the recording layer 12 is formed of a material that has a crystalline structure represented by a chemical formula $A_xN_yX$, (A and M are elements different from each other), for example, a crystalline structure such as a spinel structure ($AM_2O_4$), an ilmenite structure ($AMO_3$), a delafossite structure ($AMO_2$), an $LiMoN_2$ structure ($AMN_2$), a wolframite structure ($AMO_4$), an olivine structure ($A_2MO_4$), a hollandite structure ($A_xMO_2$), a ramsdellite structure ($A_xMO_2$) or a perovskite structure ($AMO_3$).

In the example of FIG. 4, A is Zn, M is Mn, and X is O. In the recording layer 12, a small white circle indicates a diffusion ion (Zn), a large white circle indicates a negative ion (O), and a small black circle indicates a transition element ion (Mn). An initial state of the recording layer 12 is a high resistance state. However, if the fixed potential is applied to the electrode layer 11 and a negative voltage is applied to the electrode layer 13, a part of diffusion ions in the recording layer 12 moves to the side of the electrode layer 13, and the diffusion ions in the recording layer 12 decrease relative to negative ions. The diffusion ions that move to the side of the electrode layer 13 receive electrons from the electrode layer 12 and are extracted as a metal. As a result, a metal layer 14 is formed. In the recording layer 12, the negative ions become excessive, which results in increasing valence of the transition element ions in the recording layer 12. Thereby, the recording layer 12 has electron conductivity by carrier injection, and a set operation is completed. In regard to reproduction, it is only necessary to flow a minute current to a degree that the resistance change is not caused in a material that forms the recording layer 12. In order to reset a low resistance state to a high resistance state (initial state), for example, a large current may be flowed to the recording layer 12 for a sufficient time to perform Joule heating, thereby accelerating an oxidation-reduction reaction of the recording layer 12. Even when the electric field reversed to the electric field at the time of the set is applied, the reset is enabled.

Figure 5:
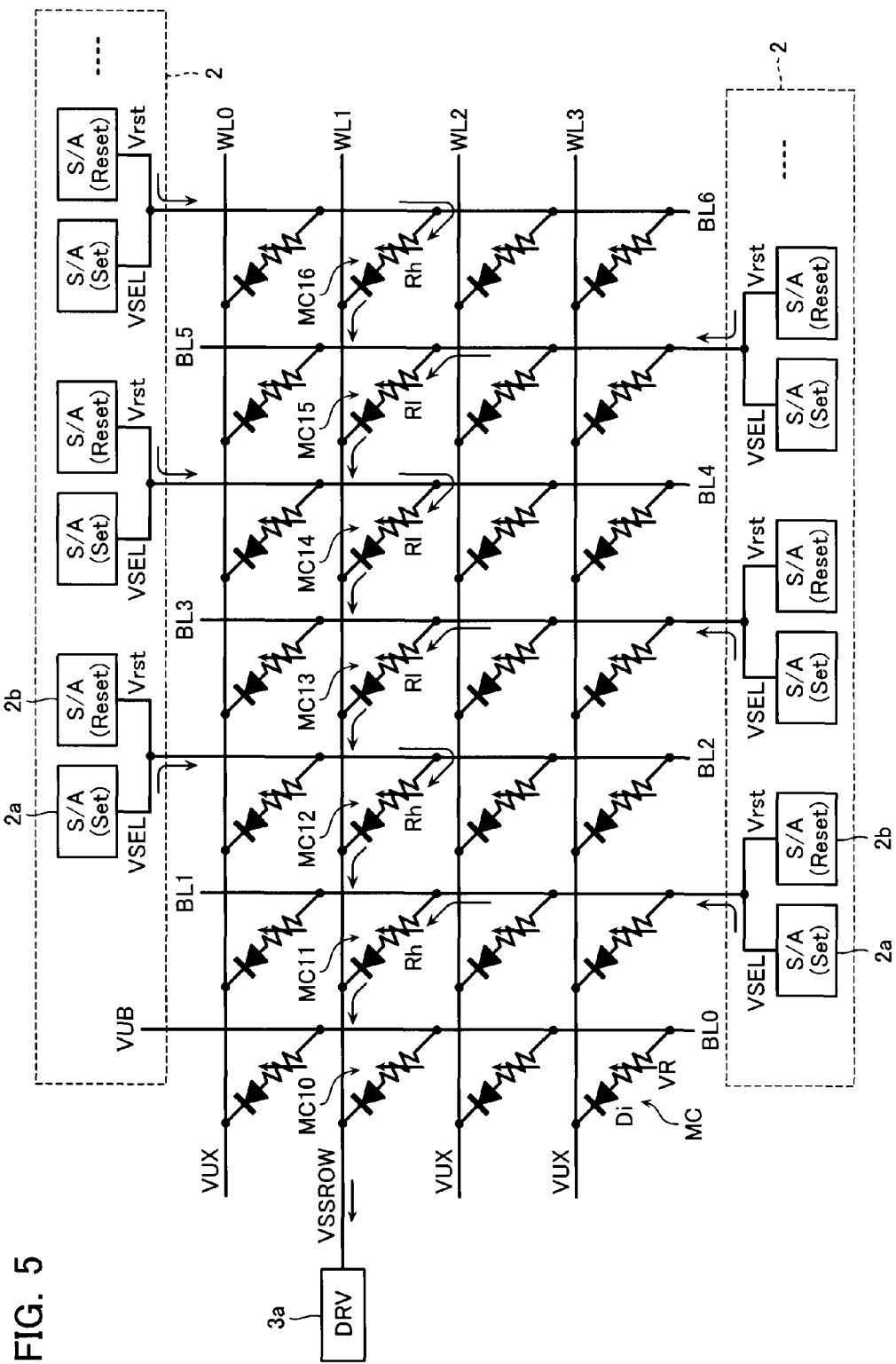
FIG. 5 is a circuit diagram of the memory cell array of the non-volatile semiconductor storage device.

FIG. 5 is an equivalent circuit diagram showing the detailed configuration of the memory cell array 1 shown in FIG. 1.

In this case, a diode D1 is used as a non-ohmic element NO, and a layer structure is described as one structure to simplify the description.

In FIG. 5, the memory cell MC includes the diode D1 and the variable resistive element VR that are connected in series. A cathode of the diode D1 is connected to the word line WL and an anode thereof is connected to the bit line BL through the variable resistive element VR. At one end of the bit line BL, a setting sense amplifier circuit 2a and a resetting sense amplifier circuit 2b that are included in the column control circuit 2 are provided. Meanwhile, in the word line WL, a word line driver 3a of the row control circuit 3 is provided. The word line driver 3a supplies a voltage, which is needed to write/erase data or read data, to the word line WL. The polarity of the diode D1 of the memory cell MC may be reversed to the polarity of the circuit shown in FIG. 5, and a current may be flowed from the word line WL side to the bit line BL side.

[Column Control Circuit]

Next, before the column control circuit 2 of the non-volatile semiconductor storage device according to this embodiment is described, a data write operation with respect to the memory cell is first described. In this case, the "data write operation" includes a reset operation for changing a resistance state of the memory cell from a low resistance state to a high resistance state, in addition to a set operation for changing the resistance state of the memory cell from the high resistance state to the low resistance state.

When the memory cell is set, a row ground voltage VSSROW close to a ground voltage VSS is supplied to the selected word line connected to the selected memory cell, and a set voltage VSEL needed to execute a set operation is supplied to the selected bit line connected to the selected memory cell. Meanwhile, a non-selected word line voltage VUX lower than the set voltage VSEL by about 0.8 V is supplied to the non-selected word line, and a non-selected bit line voltage VUB higher than the row ground voltage VSSROW by about 0.8 V is supplied to the non-selected bit lines other than the selected bit line. Thereby, since a forward bias is applied to the diode of the selected memory cell, the resistance state of the selected memory cell changes from the high resistance state to the low resistance state. On the other hand, since a backward bias is applied to the diode of the non-selected memory cell connected to the non-selected word line and the non-selected bit line, the resistance state of the memory cell does not change. The forward bias is applied to the diode of another non-selected memory cell connected to the non-selected word line and the selected bit line or the selected word line and the non-selected bit line. However, since the magnitude of the forward bias is small, the resistance state of the non-selected memory cell does not change. As a result, only the selected memory cell is set.

Meanwhile, even when the memory cell is reset, the operation is almost the same as that performed when the memory cell is set. However, instead of the set voltage VSEL, a reset voltage Vrst lower than the set voltage VSEL is supplied to the selected bit line. In this case, only the selected memory cell is reset.

The above description is an example of the set operation and the reset operation, and the voltage value and the like are not limited to those described above.

Next, the case where the plural memory cells are collectively set/reset will be described with reference to FIG. 5.

In this case of FIG. 5, a memory cell MC11 connected to a word line WL1 and a bit line BL1 enters in a reset state (high resistance state Rh), a memory cell MC12 connected to the word line WL1 and a bit line BL2 enters in a reset state (high resistance state Rh), a memory cell MC13 connected to the word line WL1 and a bit line BL3 enters in a set state (low resistance state Rl), a memory cell MC14 connected to the word line WL1 and a bit line BL4 enters in a set state (low resistance state Rl), a memory cell MC15 connected to the word line WL1 and a bit line BL5 enters in a set state (low resistance state Rl), and a memory cell MC16 connected to the word line WL1 and a bit line BL6 enters in a reset state (high resistance state Rh).

For example, the case where the memory cells MC11 to MC13 are set and the memory cells MC14 to MC16 are reset is considered.

In this case, for example, the following data write sequence is considered. That is, first, data of the memory cells MC11 to MC16 is read (read operation). Next, the memory cells other than the memory cell where the set is needed are masked based on the read data. Specifically, in addition to the reset memory cells MC14 to MC16, the memory cell MC13 already in the set state is masked. Next, the memory cells MC11 to MC16 are collectively set. Thereby, the states of only the non-masked memory cells MC11 and MC12 are changed to the set state (low resistance state Rl) (set operation). Next, the memory cells other than the memory cell where the reset is needed are masked based on the read data. Specifically, in addition to the set memory cells MC11 to MC13, the memory cell MC16 already in the reset state is masked. Next, the memory cells MC11 to MC16 are collectively reset. Thereby, the states of only the non-masked memory cells MC14 and MC15 are changed to the reset state (high resistance state Rh) (reset operation). By the above sequence, the set operation of the memory cells MC11 to MC13 and the reset operation of the memory cells MC14 to MC16 are completed.

However, in the case of the above sequence, the three steps of the read operation, the set operation, and the reset operation are needed, and the data write processing time and the power consumption may increase (in the following description, the above write sequence is called a "comparative example").

Therefore, in the non-volatile semiconductor storage device according to this embodiment, the column control circuit 2 that does not need the read operation executed before the data write operation and can execute the set operation and the reset operation in parallel is configured as follows.

Specifically, as shown in FIG. 5, the two circuits of the setting sense amplifier circuit 2a and the resetting sense amplifier circuit 2b are prepared for each bit line BL. The setting sense amplifier circuit 2a supplies the set voltage VSEL needed to execute the set operation. Meanwhile, the resetting sense amplifier circuit 2b supplies the reset voltage Vrst needed to execute the reset operation. Thereby, the set voltage VSEL and the reset voltage Vrst can be selectively supplied independently for each bit line BL.

Figure 7:
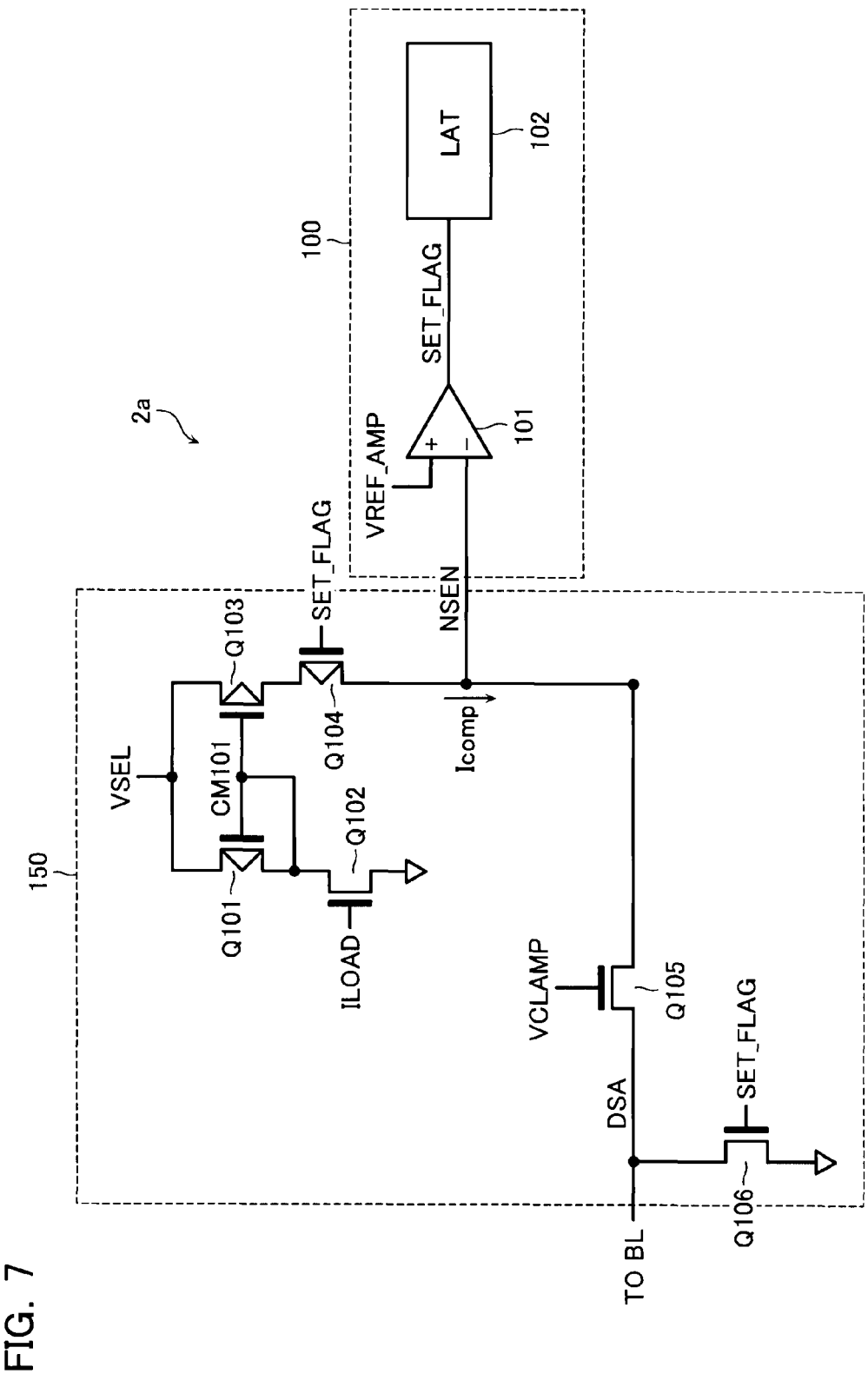
FIG. 7 is a circuit diagram of a setting sense amplifier circuit in the non-volatile semiconductor storage device.
Figure 12:
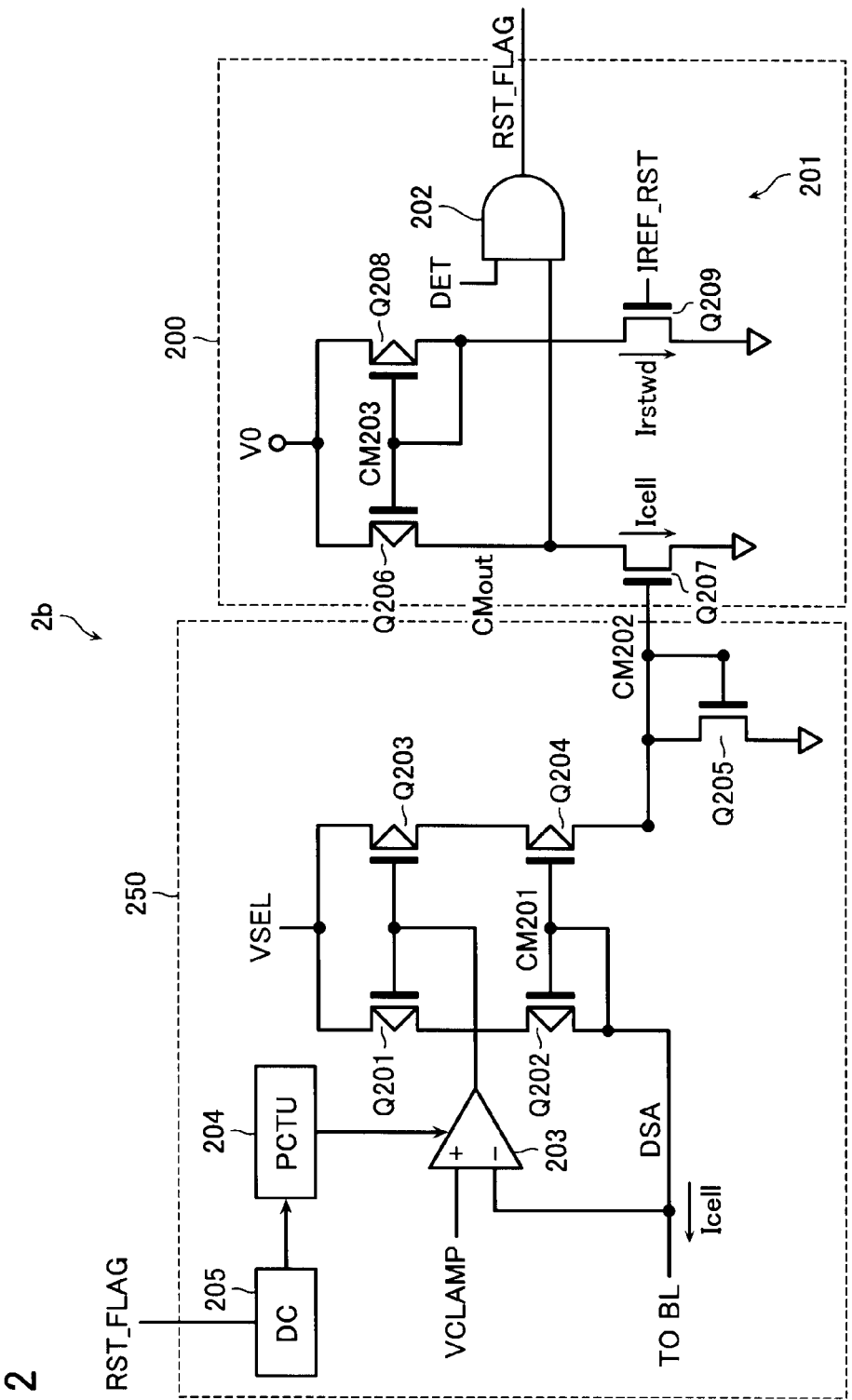
FIG. 12 is a diagram showing an operation waveform at the time of a reset operation in the non-volatile semiconductor storage device.

As shown in FIGS. 7 and 12, the setting sense amplifier circuit 2a and the resetting sense amplifier circuit 2b have a set state detecting circuit 100 and a reset state detecting circuit 200, respectively. The set state detecting circuit 100 detects whether the memory cell MC is in the set state at the time of the set operation. When the memory cell MC is in the set state, the set state detecting circuit 100 stops the set operation. Likewise, the reset state detecting circuit 200 detects whether the memory cell MC is in the reset state at the time of the reset operation. When the memory cell MC is in the reset state, the reset state detecting circuit 200 stops the reset operation. By the functions of the set state detecting circuit 100 and the reset state detecting circuit 200, the read operation before the data write operation may be omitted.

Next, the setting sense amplifier circuit 2a will be described in detail.

Figure 6:
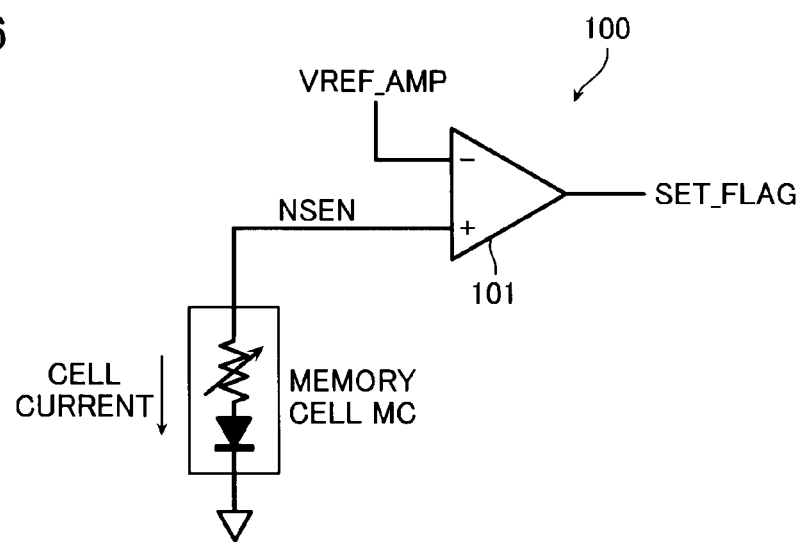
FIG. 6 is a diagram showing a set state detecting method in the non-volatile semiconductor storage device.

FIG. 6 shows a set state detecting method executed by the set state detecting circuit 100.

The set state detecting circuit 100 has a comparator 101 that compares a voltage of a sense node NSEN at the anode side of the diode of the memory cell MC and a predetermined reference voltage VREF_AMP. During the set operation, a constant cell current flows to the memory cell MC, by the setting sense amplifier circuit 2a. In this case, the decrease in the resistance value of the variable resistive element of the memory cell MC appears as the decrease in the voltage of the sense node NSEN. The set state detecting circuit 100 uses the comparator 101 to detect that the voltage of the sense node NSEN becomes the reference voltage VREF_AMP or less, thereby detecting that the memory cell MC enters in the set state.

FIG. 7 is a circuit diagram showing the setting sense amplifier circuit 2a.

The setting sense amplifier circuit 2a has a set voltage supply circuit 150 that supplies the set voltage VSEL, in addition to the set state detecting circuit 100.

The set voltage supply circuit 150 has a PMOS transistor Q101 and an NMOS transistor Q102 configured by serially connecting current paths provided between the set voltage VSEL and the ground voltage. To a gate of the transistor Q102, a load current signal ILOAD is input. Thereby, the transistors Q101 and Q102 constitute a constant current circuit. The set voltage supply circuit 150 further has PMOS transistors Q103 and Q104 configured by serially connecting current paths provided between the set voltage VSEL and the sense node NSEN, as supply paths of the set voltage, in parallel to the constant current circuit. The transistor Q103 constitutes a current mirror circuit CM101 in combination with the transistor Q101. The set voltage supply circuit 150 further has a voltage clamping NMOS transistor Q105 (clamp circuit) provided between the sense node NSEN and a node DSA linked to the bit line BL. To a gate of the transistor Q105, a clamp voltage VCLAMP is input. Thereby, a voltage of the bit line BL is clamped. The set voltage supply circuit 150 further has an NMOS transistor Q106 (discharge circuit) provided between the node DSA and the ground voltage. When the NMOS transistor Q106 is turned on, the voltage of the bit line BL is discharged.

The set state detecting circuit 100 has a comparator 101 that compares the voltage of the sense node NSEN and the constant reference voltage VREF_AMP and a latch circuit 102 that holds a state of a set flag SET_FLAG corresponding to the comparison result. The set flag SET_FLAG that is an output from the comparator 101 is input to bases of the transistors Q104 and Q106 of the set voltage supply circuit 150. Thereby, when the set flag SET_FLAG becomes "H," the transistor Q104 is turned off. Therefore, the supply of the set voltage VSEL from the set voltage supply circuit 150 to the selected memory cell is stopped. Since the transistor Q106 is turned on, the voltage of the bit line BL is discharged.

Next, the set operation using the setting sense amplifier circuit 2a that has the above configuration will be described.

Figure 8:
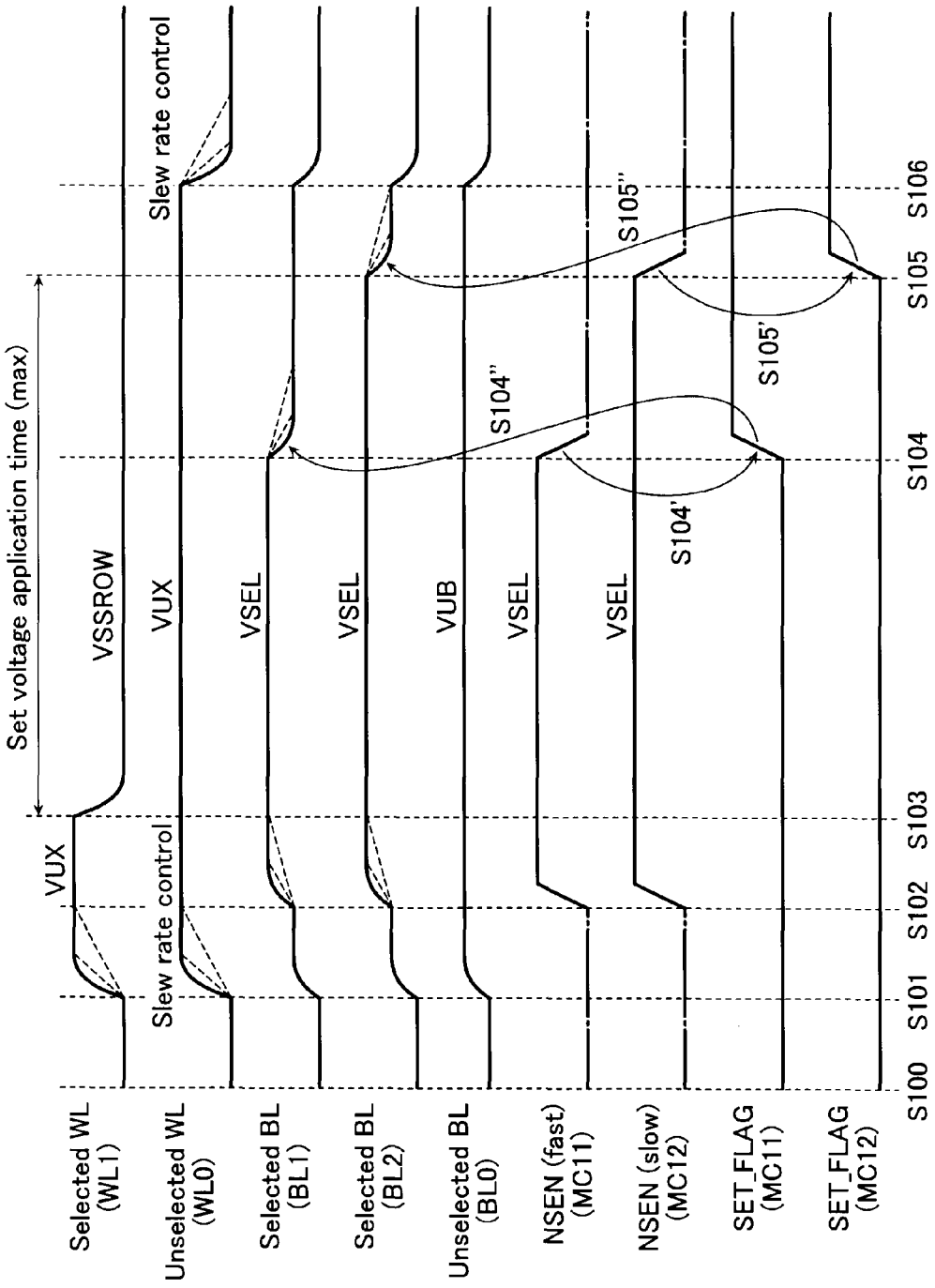
FIG. 8 is a diagram showing an operation waveform at the time of a set operation in the non-volatile semiconductor storage device.
Figure 9:
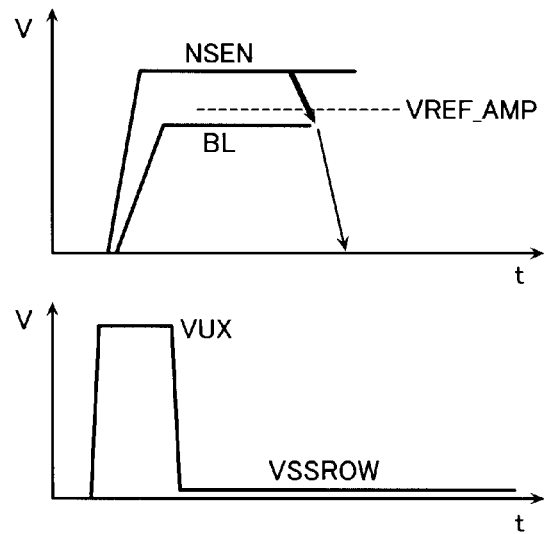
FIG. 9 is a diagram showing an operation waveform at the time of a set operation in the non-volatile semiconductor storage device.

FIGS. 8 and 9 are operation waveform diagrams at the time of the set operation in the non-volatile semiconductor storage device according to this embodiment.

Before the set operation (step S100), the voltages of all of the word line WL, the bit line BL, and the sense node NSEN become the ground voltage.

First, in step S101, a non-selected word line voltage VUX is supplied to the word line WL and a non-selected bit line voltage VUB is supplied to the bit line BL.

Next, in step S102, the set voltage VSEL is supplied from the set voltage supply circuit 150 to the selected bit lines BL1 and BL2. At this time, the voltage of the sense node NSEN increases to the set voltage VSEL.

Next, in step S103, the voltage of the selected word line WL1 is decreased to the word line ground voltage VSSROW. Thereby, a voltage VSEL-VSSROW is applied to the memory cells MC11 and MC12. At this time, as shown in FIG. 9, a resistance state of the memory cells MC11 and MC12 is a high resistance state, and the voltage of the sense node NSEN is also higher than the reference voltage VREF_AMP. Therefore, the set flag SET_FLAG that is an output from the comparator 101 remains "L."

Next, in step S104, the set operation of the memory cell MC11 is completed. If the set operation is completed, the resistance state of the memory cell MC11 becomes a low resistance state. In this case, since the voltage of the sense node NSEN linked to the memory cell MC11 also becomes lower than the reference voltage VREF_AMP, the set flag SET_FLAG becomes "H" (step S104'). If the set flag SET_FLAG becomes "H" in this manner, the transistor Q104 of the set voltage supply circuit 150 is turned off. Thereby, the supply of the set voltage VSEL from the set voltage supply circuit 150 to the bit line BL1 is stopped (step S104").

Next, in step S105, the set operation of the memory cell MC12 is completed. In this case, similar to step S104, the voltage of the sense node NSEN linked to the memory cell MC12 becomes lower than the reference voltage VREF_AMP, and the set flag SET_FLAG becomes "H" (step S105'). Thereby, the supply of the set voltage VSEL from the set voltage supply circuit 150 to the bit line BL2 is stopped (step S105").

Finally, in step S106, upon the set operation completion of the memory cells MC11 and MC12 that need the set operation, the supply of the non-selected word line voltage VUX to the non-selected word line WL0 is stopped.

In this way, the set operation with respect to the memory cells MC11 and MC12 is completed.

Figure 10:
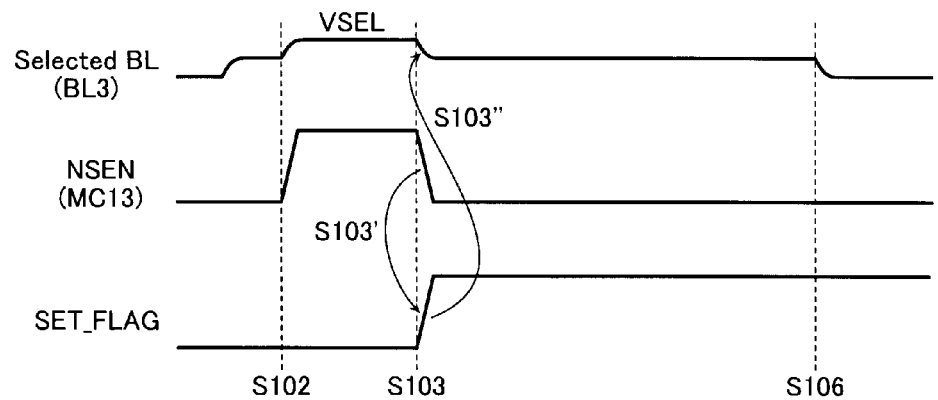
FIG. 10 is a diagram showing an operation waveform at the time of a set operation in the non-volatile semiconductor storage device.

Next, the operation performed when the memory cell MC13 already in the set state is set will be described with reference to the operation waveform of FIG. 10.

The processes of steps S100 to S102 are the same as those of when the memory cells MC11 and MC12 are set.

Next, in step S103, the resistance state of the memory cell MC13 is already a low resistance state, and the voltage of the sense node NSEN linked to the memory cell MC13 is already lower than the reference voltage VREF_AMP. For this reason, the set flag SET_FLAG immediately becomes "H" (step S103'). Thereby, the supply of the set voltage VSEL from the set voltage supply circuit 150 to the bit line BL3 is immediately stopped (step S103").

As described above, when the setting sense amplifier circuit 2a according to this embodiment is used, the set operation with respect to the memory cell already in the set state is immediately stopped. For this reason, as in the data write method according to the comparative example, the read operation that is executed in advance to set the mask may be omitted. During the set operation, it is detected that the state of the memory cell is changed to the set state, and the supply of the voltage to the memory cell is immediately stopped. Therefore, erroneous reset with respect to the memory cell can be avoided, the memory cell can be prevented from being deteriorated due to the excessive voltage supply, and the wasteful power consumption during the set operation can be suppressed.

Next, the resetting sense amplifier circuit 2b will be described in detail.

Figure 11:
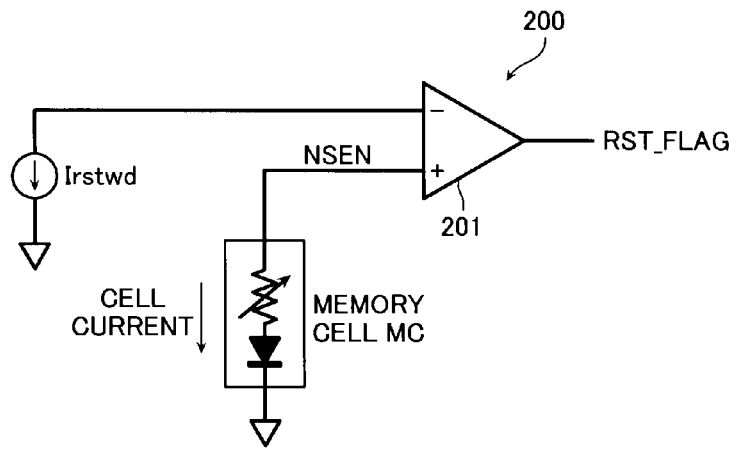
FIG. 11 is a diagram showing a reset state detecting method in the non-volatile semiconductor storage device.

FIG. 11 shows a reset state detecting method executed by the reset state detecting circuit 200.

The reset state detecting circuit 200 has a comparator 201 that compares the cell current flowing to the memory cell MC and the predetermined reference current Irstwd. During the reset operation, a constant reset voltage is supplied to the memory cell MC, by the resetting sense amplifier circuit 2b. In this case, the increase in the resistance value of the variable resistive element of the memory cell MC appears as the decrease in the cell current. The reset state detecting circuit 200 uses the comparator 201 to detect that the cell current becomes the reference current Irstwd or less, thereby detecting that the memory cell MC enters in the reset state.

FIG. 12 is a circuit diagram showing the resetting sense amplifier circuit 2b.

The resetting sense amplifier circuit 2b has a reset voltage supply circuit 250 that supplies the reset voltage Vrst, in addition to the reset state detecting circuit 200.

The reset voltage supply circuit 250 has PMOS transistors Q201 and Q202 configured by serially connecting current paths provided between the set voltage VSEL and the node DSA. The reset voltage supply circuit 250 further has PMOS transistors Q203 and Q204 configured by serially connecting current paths provided between the set voltage VSEL and the ground line. The transistor Q204 constitutes a current mirror circuit CM201 in combination with the PMOS transistor Q202. The reset voltage supply circuit 250 further has an operational amplifier 203 of which a positive input terminal is connected to the predetermined clamp voltage VCLAMP, a negative input terminal is connected to the node DSA, and an output terminal is connected to gates of the transistors Q201 and Q203. The operational amplifier 203 controls the transistors Q201 and Q203 according to the difference between the clamp voltage VCLAMP and the voltage of the node DSA. Thereby, the reset voltage supply circuit 250 can generate the reset voltage Vrst from the set voltage VSEL and stably supply the reset voltage to the bit line BL. In this case, the operational amplifier 203 is driven by a power supply control unit 204 operated by receiving a direct-current voltage from a direct-current power supply 205.

The reset state detecting circuit 200 has a PMOS transistor Q206 and an NMOS transistor Q207 configured by serially connecting current paths provided between the predetermined voltage V0 and the ground voltage. The transistor Q207 constitutes a current mirror circuit CM202 in combination with the transistor Q205 of the reset voltage supply circuit 250. Therefore, the cell current Icell that flows to the node DSA through the current mirror circuits CM201 and CM202 flows to the transistor Q207. That is, the transistor Q207 functions as an input unit of the cell current Icell of the reset state detecting circuit 200. The reset state detecting circuit 200 further has a PMOS transistor Q208 and an NMOS transistor Q209 configured by serially connecting current paths provided between the voltage V0 and the ground voltage. The transistor Q208 constitutes a current mirror circuit CM203 in combination with the transistor Q206. Meanwhile, the transistor Q209 is controlled by the reference current signal IREF_RST. Thereby, the transistor Q209, as a constant current circuit, flows the constant reference current Irstwd. The reference current Irstwd flows to the transistor Q206 through the current mirror circuit CM203. As a result, a current Irstwd-Icell can be extracted from a node CMout between the transistors Q206 and Q207. The reset state detecting circuit 200 further has an AND circuit 202 (detecting circuit) whose input terminal is connected to the node CMout. To the other side of the AND circuit 202, a detection signal DET is input. That is, the reset flag RST_FLAG that is an output from the AND circuit 202 becomes "H" only when the detection signal DET is activated and the cell current Icell is smaller than the reference current Irstwd. The reset flag RST_FLAG is used in controlling the direct-current power supply 205. When the reset flag RST_FLAG is "H," the direct-current power supply 205 is inactivated. As a result, the supply of the reset voltage Vrst from the reset voltage supply circuit 250 to the bit line BL is stopped. The transistors Q206 to Q209 and the AND circuit 202 constitute the comparator 201 shown in FIG. 12. An output portion of the reset flag RST_FLAG may have the same configuration as the output portion of the set flag SET_FLAG. The set flag SET_FLAG and the reset flag RST_FLAG may be latched to a latch circuit through an OR circuit (not shown).

Next, the reset operation using the resetting sense amplifier circuit 2b that has the above configuration will be described.

Figure 13:
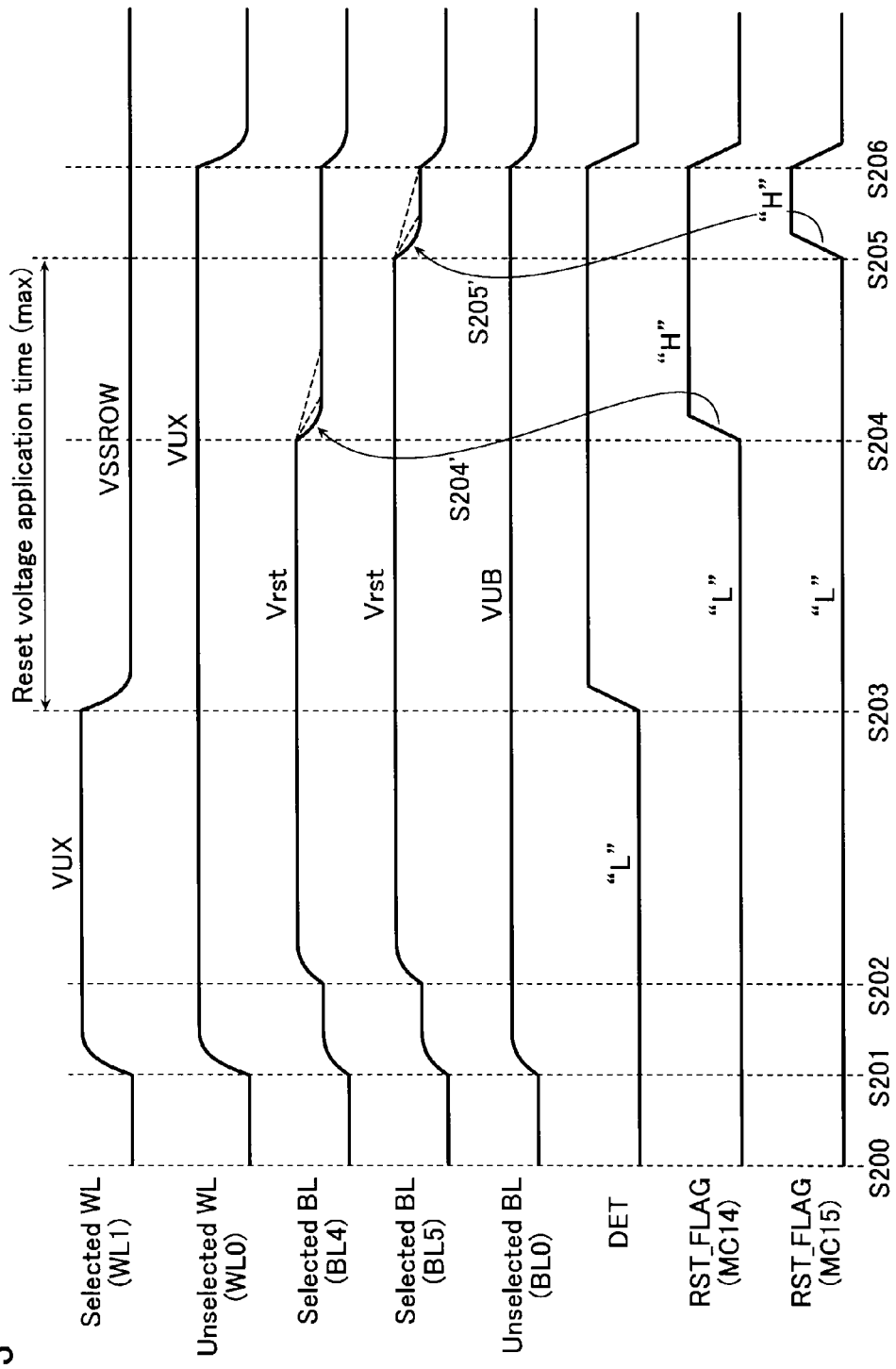
FIG. 13 is a diagram showing an operation waveform at the time of a reset operation in the non-volatile semiconductor storage device.
Figure 14:
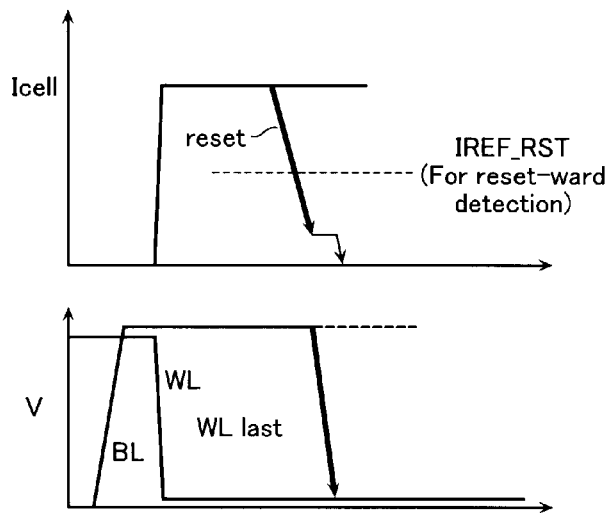
FIG. 14 is a diagram showing an operation waveform at the time of a reset operation in the non-volatile semiconductor storage device.

FIGS. 13 and 14 are operation waveform diagrams at the time of the reset operation in the non-volatile semiconductor storage device according to this embodiment.

Before the reset operation (step S200), the voltages of both the word line WL and the bit line BL become the ground voltage.

First, in step S201, the non-selected word line voltage VUX is supplied to the word line WL and the non-selected bit line voltage VUB is supplied to the bit line BL.

Next, in step S202, the reset voltage Vrst is supplied from the reset voltage supply circuit 250 to the selected bit lines BL4 and BL5.

Next, in step S203, the voltage of the selected word line WL1 is decreased to the word line ground voltage VSSROW. Thereby, the voltage Vrst-VSSROW is applied to the memory cells MC14 and MC15. The detection signal DET becomes "H" and detection of the cell current Icell based on the AND circuit 202 starts. At this time, as shown in FIG. 14, a resistance state of the variable resistive elements of the memory cells MC14 and MC15 is a low resistance state, and the cell current Icell is larger than the reference current Irstwd. Therefore, the reset flag RST_FLAG that is an output from the AND circuit 202 remains "L."

Next, in step S204, the reset operation of the memory cell MC14 is completed. If the reset operation is completed, the resistance state of the memory cell MC14 becomes a high resistance state. Therefore, as shown in FIG. 14, since the cell current Icell becomes smaller than the reference current Irstwd, the reset flag RST_FLAG that corresponds to the memory cell MC14 becomes "H." If the reset flag RST_FLAG becomes "H" in this manner, the direct-current power supply 205 of the reset voltage supply circuit 250 is inactivated. Thereby, the supply of the reset voltage Vrst from the reset voltage supply circuit 250 to the bit line BL4 is stopped (step S204').

Next, in step S205, the reset operation of the memory cell MC15 is completed and the reset flag RST_FLAG that corresponds to the memory cell MC15 becomes "H." As a result, the supply of the reset voltage Vrst from the reset voltage supply circuit 250 to the bit line BL5 is stopped (step S205').

Finally, in step S206, upon the reset operation completion of the memory cells MC14 and MC15 that need the reset operation, the supply of the non-selected word line voltage VUX to the non-selected word line WL0 is stopped. Further, the detection signal DET is set to "L" and the reset flag RST_FLAG corresponding to the output from the AND circuit 202 is set to "L" in order to prepare for the following reset operation.

In this way, the reset operation with respect to the memory cells MC14 and MC15 is completed.

Figure 15:
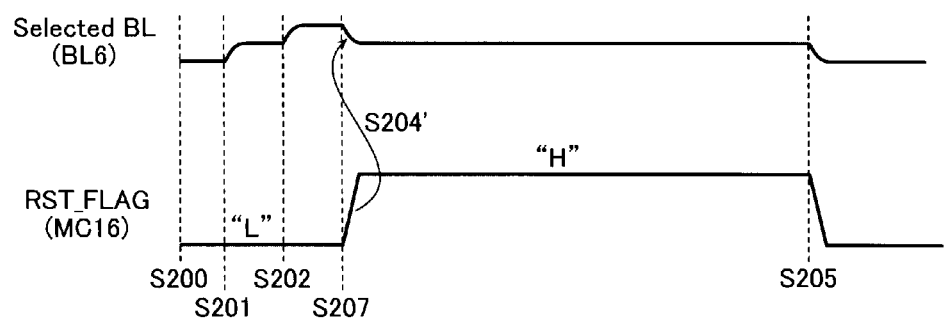
FIG. 15 is a diagram showing an operation waveform at the time of a reset operation in the non-volatile semiconductor storage device.

Next, the operation performed when the memory cell MC16 already in the reset state is reset will be described with reference to the operation waveform of FIG. 15.

The processes of steps S200 to S202 are the same as those of when the memory cells MC14 and MC15 are reset.

Next, in step S207, since the resistance state of the memory cell MC16 is already a high resistance state, the cell current Icell that flows to the memory cell MC16 is smaller than the reference current Irefwd. For this reason, the reset flag RST_FLAG immediately becomes "H." Thereby, the supply of the reset voltage Vrst from the reset voltage supply circuit 250 to the bit line BL6 is immediately stopped.

As described above, when the resetting sense amplifier circuit 2b according to this embodiment is used, the reset operation with respect to the memory cell in the reset state is immediately stopped. For this reason, as in the data write method according to the comparative example, the read operation that is executed in advance to set the mask may be omitted. During the reset operation, it is detected that the state of the memory cell is changed to the reset state, and the supply of the voltage with respect to the memory cell is immediately stopped. Therefore, erroneous set with respect to the memory cell can be avoided, the memory cell can be prevented from being deteriorated due to the excessive voltage supply, and the wasteful power consumption during the reset operation can be suppressed.

According to the non-volatile semiconductor storage device according to this embodiment, the data write processing time can be shortened and the power consumption according to the data write can be decreased.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A non-volatile semiconductor storage device, comprising:
    a memory cell array having a plurality of first wiring lines, a plurality of second wiring lines disposed to intersect the first wiring lines, and a plurality of electrically rewritable memory cells disposed at intersections of the first and second wiring lines, each memory cell including a variable resistive element storing resistance values as data in a non-volatile manner; and
    a data writing unit that has a voltage supply circuit which supplies a voltage needed to write data to the plurality of memory cells through the first and second wiring lines, and a resistance state detecting circuit which detects a resistance state of the variable resistive element at the time of writing the data,
    the data writing unit stopping the supply of the voltage to the memory cell where a resistance state of the variable resistive element becomes a desired resistance state, among the plurality of memory cells, according to the detection result of the resistance state detecting circuit, wherein
    the data writing unit includes, for each of the memory cells where the data is simultaneously written:
    a set voltage supply circuit which supplies a set voltage to change the resistance state of the variable resistive element from a high resistance state to a low resistance state; and
    a set state detecting circuit which detects that the variable resistive element is in the low resistance state.

2. A non-volatile semiconductor storage device, comprising:
    a memory cell array having a plurality of first wiring lines, a plurality of second wiring lines disposed to intersect the first wiring lines, and a plurality of electrically rewritable memory cells disposed at intersections of the first and second wiring lines, each memory cell including a variable resistive element storing resistance values as data in a non-volatile manner; and
    a data writing unit that has a voltage supply circuit which supplies a voltage needed to write data to the plurality of memory cells through the first and second wiring lines, and a resistance state detecting circuit which detects a resistance state of the variable resistive element at the time of writing the data,
    the data writing unit stopping the supply of the voltage to the memory cell where a resistance state of the variable resistive element becomes a desired resistance state, among the plurality of memory cells, according to the detection result of the resistance state detecting circuit, wherein
    the data writing unit includes, for each of the memory cells where the data is simultaneously written:
    a reset voltage supply circuit which supplies a reset voltage to change the resistance state of the variable resistive element from a low resistance state to a high resistance state; and
    a reset state detecting circuit which detects that the variable resistive element is in the high resistance state.

3. The non-volatile semiconductor storage device according to claim 1, wherein
    a reset voltage supply circuit which supplies a reset voltage to change the resistance state of the variable resistive element from the low resistance state to the high resistance state; and
    a reset state detecting circuit which detects that the variable resistive element is in the high resistance state.

4. The non-volatile semiconductor storage device according to claim 1, wherein
    the set voltage supply circuit has a constant current circuit that flows a constant current to the memory cells, and
    the set state detecting circuit has a comparator that compares a voltage of an output node of the constant current circuit with a constant reference voltage.

5. The non-volatile semiconductor storage device according to claim 2, wherein
    the reset voltage supply circuit has a constant voltage circuit that maintains a reset voltage at a constant value with respect to the memory cells, and
    the reset state detecting circuit has a comparator that compares a cell current flowing to the memory cells with a constant reference current.

6. The non-volatile semiconductor storage device according to claim 1, wherein
    the variable resistive element of the memory cell is a ReRAM.

7. A non-volatile semiconductor storage device, comprising:
    a memory cell array having a plurality of first wiring lines, a plurality of second wiring lines disposed to intersect the first wiring lines, and a plurality of electrically rewritable memory cells disposed at intersections of the first and second wiring lines, each memory cell including a variable resistive element storing resistance values as data in a non-volatile manner; and a data writing unit that has a set voltage supply circuit which supplies a voltage needed for a set operation for changing a resistance state of the variable resistive element from a high resistance state to a low resistance state to the plurality of memory cells through the first and second wiring lines, and a set state detecting circuit which detects that the variable resistive element is in the low resistance state based on the voltage applied to the memory cells at the time of the set operation, the data writing unit stopping the supply of the set voltage to the memory cell where the resistance state of the variable resistive element becomes the low resistance state, among the plurality of memory cells, according to the detection result of the set state detecting circuit, wherein a comparator of the set state detecting circuit outputs a set flag signal that is activated when the variable resistive element of the memory cell is in the low resistance state, and the set voltage supply circuit turns off a supply path of the set voltage with respect to the memory cells, when the set flag signal is activated.

8. The non-volatile semiconductor storage device according to claim 7, wherein
the data writing unit has the set voltage supply circuit and the set state detecting circuit, for each of the memory cells where the data is simultaneously written.

9. The non-volatile semiconductor storage device according to claim 7, wherein
the set voltage supply circuit has a constant current circuit that flows a constant current to the memory cells, and
the set state detecting circuit has a comparator that compares a voltage of an output node of the constant current circuit with a constant reference voltage.

10. The non-volatile semiconductor storage device according to claim 7, wherein
the set voltage supply circuit has a discharge circuit that discharges the voltage of the first wiring lines or the second wiring lines, when the set flag signal is activated.

11. The non-volatile semiconductor storage device according to claim 9, wherein
the set voltage supply circuit has a clamp circuit that restricts the voltage supplied to the memory cell, between an output node of the constant current circuit and the memory cell.

12. The non-volatile semiconductor storage device according to claim 7, wherein
the set state detecting circuit has a latch circuit that holds an output of the set state detecting circuit.

13. A non-volatile semiconductor storage device, comprising:
a memory cell array having a plurality of first wiring lines, a plurality of second wiring lines disposed to intersect the first wiring lines, and a plurality of electrically rewritable memory cells disposed at intersections of the first and second wiring lines, each memory cell including a variable resistive element storing resistance values as data in a non-volatile manner; and a data writing unit that has a reset voltage supply circuit which supplies a reset voltage needed for a reset operation for changing a resistance state of the variable resistive element from a low resistance state to a high resistance state to the plurality of memory cells through the first and second wiring lines, and a reset state detecting circuit which detects that the variable resistive element is in the high resistance state based on a cell current flowing to the memory cells at the time of the reset operation, the data writing unit stopping the supply of the reset voltage to the memory cell where the resistance state of the variable resistive element becomes the high resistance state, among the plurality of memory cells, according to the detection result of the reset state detecting circuit.

14. The non-volatile semiconductor storage device according to claim 13, wherein
the data writing unit has the reset voltage supply circuit and the reset state detecting circuit, for each of the memory cells where the data is simultaneously written.

15. The non-volatile semiconductor storage device according to claim 13, wherein
the reset voltage supply circuit has a constant voltage circuit that maintains the reset voltage at a constant value, and
the reset state detecting circuit has a comparator that compares the cell current flowing to the memory cells with a constant reference current.

16. The non-volatile semiconductor storage device according to claim 15, wherein
the comparator of the reset state detecting circuit outputs a reset flag signal that is activated when the variable resistive element of the memory cell is in the high resistance state, and
the reset voltage supply circuit inactivates the constant voltage circuit, when the reset flag signal is activated.

17. The non-volatile semiconductor storage device according to claim 15, wherein
the comparator of the reset state detecting circuit includes:
a constant current circuit that flows the reference current;
a current mirror circuit serially connected to an input side of the constant current circuit;
a cell current input unit serially connected to an output side of the current mirror circuit; and
a detecting circuit that detects a difference between the reference current whose input is connected between the current mirror circuit and the cell current input unit, and the cell current.

18. The non-volatile semiconductor storage device according to claim 17, wherein
the reset voltage supply circuit has a current mirror circuit that flows the cell current to the cell current input unit of the comparator of the reset state detecting circuit.

19. The non-volatile semiconductor storage device according to claim 2, wherein
the variable resistive element of the memory cell is a ReRAM.

* * * * *